US009455228B2

(12) United States Patent
Yazar et al.

(10) Patent No.: US 9,455,228 B2
(45) Date of Patent: Sep. 27, 2016

(54) SELF-SHIELDED COMPONENTS AND METHODS FOR MAKING THE SAME

(71) Applicant: Apple Inc., Cupertino, CA (US)

(72) Inventors: Altan N. Yazar, Cupertino, CA (US); Kiavash Baratzadeh, Cupertino, CA (US); Michael J. Reilly, Cupertino, CA (US); Sean A. Mayo, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 109 days.

(21) Appl. No.: 14/146,895

(22) Filed: Jan. 3, 2014

(65) Prior Publication Data

US 2015/0194387 A1 Jul. 9, 2015

(51) Int. Cl.
*H05K 9/00* (2006.01)
*H01L 23/552* (2006.01)
*H05K 1/02* (2006.01)
*H05K 3/34* (2006.01)
*H01L 23/00* (2006.01)

(52) U.S. Cl.
CPC ........... *H01L 23/552* (2013.01); *H05K 1/0216* (2013.01); *H05K 9/0028* (2013.01); *H01L 24/32* (2013.01); *H01L 24/48* (2013.01); *H01L 24/73* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2225/0651* (2013.01); *H01L 2225/06537* (2013.01); *H01L 2225/06562* (2013.01); *H01L 2924/12044* (2013.01); *H01L 2924/15311* (2013.01); *H05K 1/0218* (2013.01); *H05K 1/0243* (2013.01); *H05K 3/3436* (2013.01); *H05K 2201/0715* (2013.01)

(58) Field of Classification Search
CPC ................... H05K 9/0028; H05K 2201/0715
USPC ........................................................ 257/659
See application file for complete search history.

(56) References Cited

U.S. PATENT DOCUMENTS

| 8,493,749 | B2 | 7/2013 | Myers et al. | |
|---|---|---|---|---|
| 2005/0064626 | A1 | 3/2005 | Light et al. | |
| 2010/0319981 | A1 | 12/2010 | Kapusta et al. | |
| 2011/0085316 | A1 | 4/2011 | Myers et al. | |
| 2012/0140423 | A1* | 6/2012 | Fisher, Jr. .............. | H05K 3/284 361/748 |
| 2012/0193770 | A1* | 8/2012 | Yamada ................ | H01L 21/561 257/659 |
| 2013/0257462 | A1* | 10/2013 | Ding .................... | G01R 1/0433 324/705 |
| 2013/0286609 | A1 | 10/2013 | Merz | |
| 2016/0073490 | A1* | 3/2016 | Branchevsky .......... | H01L 23/06 361/783 |

* cited by examiner

*Primary Examiner* — Hung V Ngo
(74) *Attorney, Agent, or Firm* — Van Court & Aldridge LLP

(57) ABSTRACT

This is directed to self-shielded components and methods for making the same. A self-shielded component can include an electromagnetic interference (EMI) shield that contains circuitry within a shielded space defined by the EMI shield. Self-shielding can be achieved by interfacing a conformal shield layer to a ground layer disposed on or within a substrate of the self-shielded component. The combination of the conformal shield layer and the around layer can form a boundary of the shielded space that envelops circuitry requiring shielding. This enables the self-shielded component to be mounted to a circuit board without requiring a shield can or other processing to impart EMI shielding. In addition, the self-shielded components include the benefits of EMI shielding while simultaneously decreasing space requirements.

14 Claims, 5 Drawing Sheets

SELF-SHIELDED COMPONENTS AND METHODS FOR MAKING THE SAME

TECHNICAL FIELD

This specification is directed to using electromagnetic interference (EMI) shielding for components of an electronic device. In particular, this is directed to a self-shielded component and methods for making the same.

BACKGROUND

A portable electronic device can include several components coupled to a circuit board for providing processing and other device operations. Some of the components can generate electromagnetic waves that interfere with the operation of other components of the device. For example, circuitry associate with connecting to a communications network can interfere with other device components (e.g., sensor arrays). To protect the components from such interference, different approaches can be used. In one embodiment a conductive can shielding can be constructed around the components. For example, a frame can be soldered around the periphery of the components, and a cover can be attached to the frame.

The frame and cover approach, however, may require two distinct components, constructed from sheets of conductive material (e.g., from sheet metal) added to the circuit board supporting the electronic device components. This can in turn require additional space within the device for the EMI shield, which may place a limit on the device size.

SUMMARY

This is directed to self-shielded components and methods for making the same. A self-shielded component can include an electromagnetic interference (EMI) shield that contains circuitry within a shielded space defined by the EMI shield. Self-shielding can be achieved by interfacing a conformal shield layer to a ground layer disposed on or within a substrate of the self-shielded component. The combination of the conformal shield layer and the ground layer can form a boundary of the shielded space that envelops circuitry requiring shielding. This enables the self-shielded component to be mounted to a circuit board without requiring a shield can or other processing to impart EMI shielding. In addition, the self-shielded components include the benefits of EMI shielding while simultaneously decreasing space requirements.

In one embodiment, a self-shielded component can include an integrated circuit package that includes a substrate, a ground layer having at least one shield layer interfacing portion, and a die mounted on the substrate. The self-shielded component can include a conformal shield layer disposed about the integrated circuit package and interfacing with the at least one shield layer interfacing portion. The conformal shield layer and the ground layer can form an electromagnetic interference (EMI) shield.

In another embodiment, a system can include a circuit board, a self-shielded component mounted to the circuit board, and at least one EMI generating component mounted to the circuit board. The self-shielded component can include an electromagnetic interference (EMI) shield that encompasses circuitry contained within a shielded interior space of the EMI shield. The EMI generating component can generate EMI signals that can potentially interfere with the circuitry contained with the shielded interior space of the EMI shield. The EMI shield effectively shields the circuitry from any EMI signals generated by the at least one EMI generating component.

In yet another embodiment, a method can include preparing a component for receiving a conformal shielding layer, wherein a prepared component can include circuitry and a grounding layer including a plurality of exposed interfacing portions. The method can include applying a conformal shield layer to the prepared component such that the prepared component is encapsulated by the conformal shield layer, wherein the conformal shield layer and the grounding layer form an electromagnetic interference (EMI) shield when the exposed interfacing portions are coupled to the conformal shield layer, thereby providing a self-shielded component.

A further understanding of the nature and advantages of the embodiments discussed herein may be realized by reference to the remaining portions of the specification and the drawings.

DETAILED DESCRIPTION OF THE DISCLOSURE

In the following detailed description, for purposes of explanation, numerous specific details are set forth to provide a thorough understanding of the various embodiments. Those of ordinary skill in the art will realize that these various embodiments are illustrative only and are not intended to be limiting in any way. Other embodiments will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual embodiment, numerous embodiment-specific decisions may be required to achieve specific design objectives. These design objectives will vary from one embodiment to another and from one developer to another. Moreover, it will be appreciated that such a development effort might be complex and time-consuming but would nevertheless be a routine engineering undertaking for those of ordinary skill in the art having the benefit of this disclosure.

An electronic device can include various components that require EMI shielding. These components can shielded with a conformal coating layer that minimizes spacing requirements, at least compared to spacing requirements required of "can" type shields. The conformal coating layer can be constructed from conductive material. The conductive conformal coating can be electrically coupled to a grounding layer that can form part of a substrate of the component requiring shielding. The grounding layer may be coupled to ground in a logic board on which the component resides. A dielectric layer may exist between the component and the conductive conformal coating layer to ensure that the conductive layer does not short any circuitry within the component.

Figure 1:
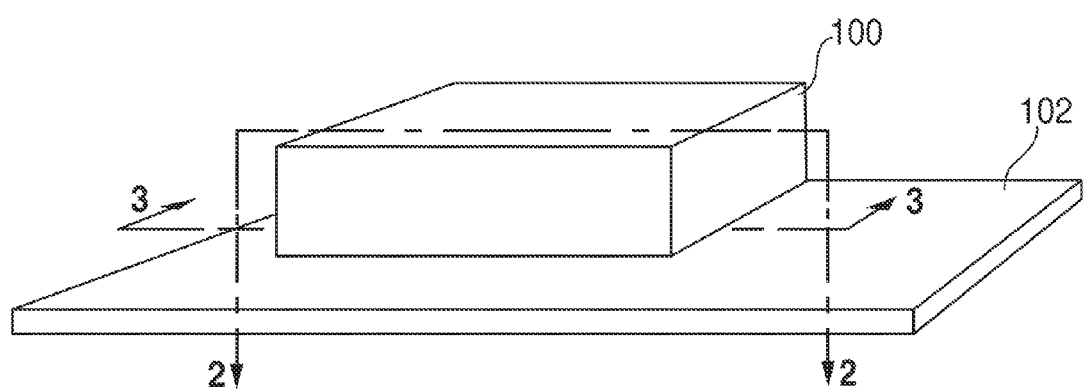
FIG. 1 shows an illustrative perspective view of self-shielded component mounted on circuit board, according to an embodiment.

FIG. 1 shows an illustrative perspective view of self-shielded component 100 mounted on circuit board 102, according to an embodiment. Self-shielded component 100 can include circuitry such as, for example, integrated circuitry, an integrated circuit package, or processor circuitry that can benefit from EMI shielding. In one embodiment, component 100 can include a non-volatile memory. The non-volatile memory can exist as part of a package that includes raw dies and controller circuitry or it can exist as raw dies only. Examples of non-volatile memory can include NAND Flash, NOR Flash, 3D memory, phase-change memory, and any future generation non-volatile memory. NAND Flash memory can be based on floating gate technology, and can be organized into "blocks" that may each be erasable at once, and further organized into "pages" that may each be programmable and readable at once. Each page of non-volatile memory can be addressed using a physical page address.

Component 100 may benefit from EMI shielding for any number of reasons. In some embodiments, component 100 may be included in a system (not shown) having other components (not shown) that radiate energy that may interfere with the operation of component 100. The other components can include any number and type of radiating sources. For example, wireless communication circuitry such as cellular band radios, WiFi radios, Bluetooth radios, and GPS radios may generate signals that may interfere with the operation of component 100, or vice versa. In other embodiments, component 100 may radiate energy that may affect operation of other system components. The radiation existing within a system including component 100 may exist at several different frequencies. The shielding portion of component 100, however, can be designed to block a range of frequencies.

Circuit board 102 can be any suitable circuit board. For example, circuit board 102 can be a main logic board of a system including component 100. Circuit board 102 can be a printed circuit board or a flexible printed circuit board. Circuit board 102 can include a ground plane or one or more ground traces (not shown) to provide signal and/or power ground for various mounted components.

Figure 2:
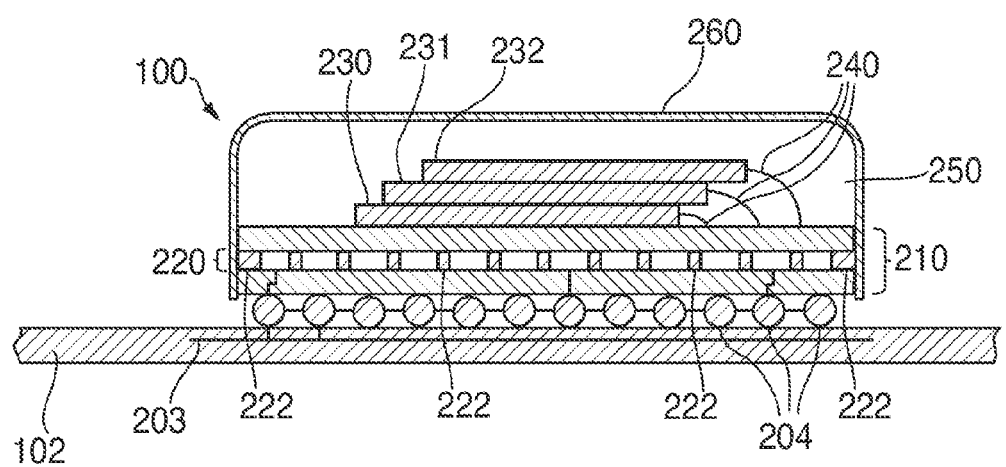
FIG. 2 shows an illustrative cross-sectional view of self-shielding component taken along line 2-2 of FIG. 1, according to an embodiment.

FIG. 2 shows an illustrative cross-sectional view of self-shielding component 100 taken along line 2-2 of FIG. 1, according to an embodiment. As shown, component 100 is mounted to circuit board 102 via solder balls 204. Circuit board 102 can include ground plane 203 and one or more of solder balls 204 can be connected to ground plane 203. Solder balls 204 can provide an electrical connection between component 100 and logic board 102. It is understood that solder balls 204 are merely illustrative and that other electrical connecting mechanisms can be used in lieu of the solder balls. For example, pins can be used. Component 100 can include substrate 210, ground layer 220, dies 230-232, conductors 240, dielectric 250, and shield 260.

Ground layer 220 may be integrated within substrate 210 (as shown), or it may reside adjacent to substrate 210. Ground layer 220 may be connected to one or more solder balls 204, some of which may be connected to ground plane 203. Ground layer 220 may include a planer region (not shown in FIG. 2, but shown in FIG. 3) having ground traces 222 extending therefrom. Ground layer 220 may prevent EMI from radiating through circuit board 202 to component 100. In addition, ground layer 220 may prevent EMI from emanating from component 100 through circuit board 202. Ground traces 222 can be coupled to shield 260. This coupling is an electrically conductive coupling that enables ground layer 220 to electrically interface with shield 260. This coupling provides the self-contained EHF shield according to various embodiments. Thus, the self-contained EHF shield for component 100 can include ground layer 220, its ground traces 222, and shield 260. The self-contained EHF shield may be grounded to ground plane 203 of circuit board 202 via solder balls 204.

Dies 230-232 can be stacked on top of each other and can reside on top of substrate 210. Wires 240 may connect dies 230-232 to circuitry (e.g., a controller), traces, bond pads, etc. contained within component 100. Dielectric 250 may permeate and/or encapsulate dies 230-232 and wires 240 to prevent potential for any short circuiting with shield 260. Dielectric 250 can be any suitable non-conductive material. Examples of dielectric can include an epoxy, plastic, or rubber. Shield 260 may be constructed from a metal or a combination of metals. Examples can include copper, nickel, silver, gold, and combinations thereof. Shield 260 can applied to component 100 using, for example, an electroplating process, a sputtering process, or other suitable process.

During manufacturing of component 100, ground traces 222 may be exposed so that they can be coupled to shield 260 when shield 260 is applied to component 100. Exposure of ground traces can be accomplished using a variety of different techniques. In one approach, the ground traces may be manufactured to have exaggerated or excess dimensions so that the traces remain exposed after dielectric 250 is applied. In another approach, a releasable substance (e.g., a releasable adhesive) may cover ground traces 222 during application of dielectric 250, and removed application thereof to expose the traces. In yet another embodiment, dielectric 250 may be cut (e.g., using a mechanical tool or a laser) away to expose traces 222.

Figure 3:
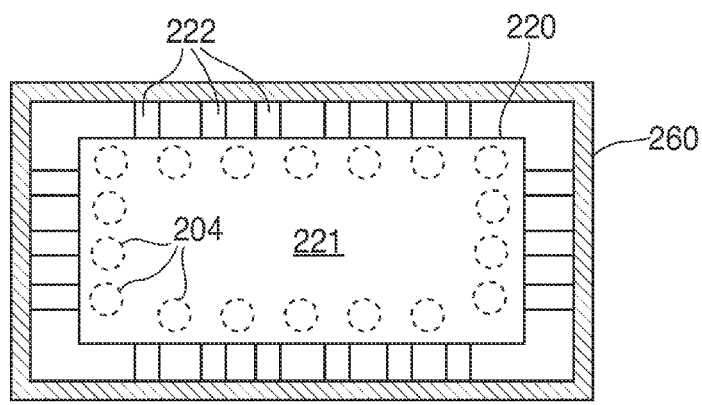
FIG. 3 shows an illustrative cross-sectional view of component taken along line 3-3 of FIG. 1, according to an embodiment.

FIG. 3 shows an illustrative cross-sectional view of component 100 taken along line 3-3 of FIG. 1, according to an embodiment. FIG. 3 shows with more particularity an illustrative top view of ground layer 220, including planer region 221 and around traces 222. FIG. 3 also shows ground traces 222 interfacing with conformal shield layer 260. Solder balls 204, demarcated by hidden lines, are also shown. In embodiments where planer region 221 does not directly interface with shield layer 260, but instead interfaces with shield layer 260 via ground traces 222, interstitial gaps between adjacent ground traces 222 and between planer region 221 and planer region 221. The size of these gaps may be precisely controlled to limit pass through of EMI signals. For example, the distance, d, between adjacent ground traces 222 may be set to be less than a predetermined distance. In addition, the distance, L, between planer region 221 and shield layer 260 may be set to be less than a predetermined distance. In some embodiments, d and L can be substantially similar or different. In some embodiments, the dimensions selected for d and L can be based on the frequency range of EMI signals to be blocked. For example, the dimension selected for d and L can be selected based on the results of equation 1, below:

$$d = L = \lambda/20 \quad (1)$$

where λ is the wavelength of a waveform traveling at a constant speed.

Figure 4:
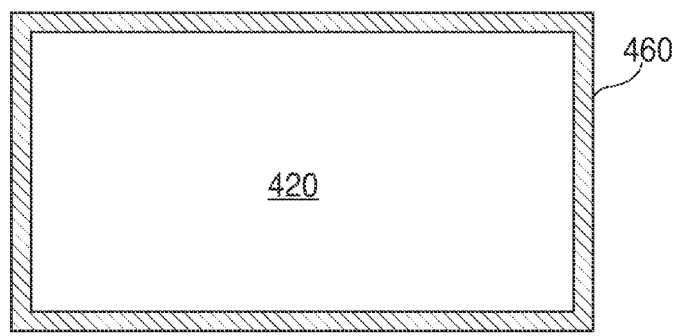
FIG. 4 shows an alternative illustrative cross-sectional view of a grounding layer interfacing with a conformal shielding layer of a self-shielded component, according to an embodiment.

FIG. 4 shows an alternative illustrative cross-sectional view of a grounding layer 420 interfacing with a conformal shielding layer 460 of a self-shielded component, in accordance with an embodiment. As shown in this embodiment, no ground traces are required to interface grounding layer 420 to shielding layer 460 since grounding layer directly interfaces with shielding layer 460.

Figure 5:
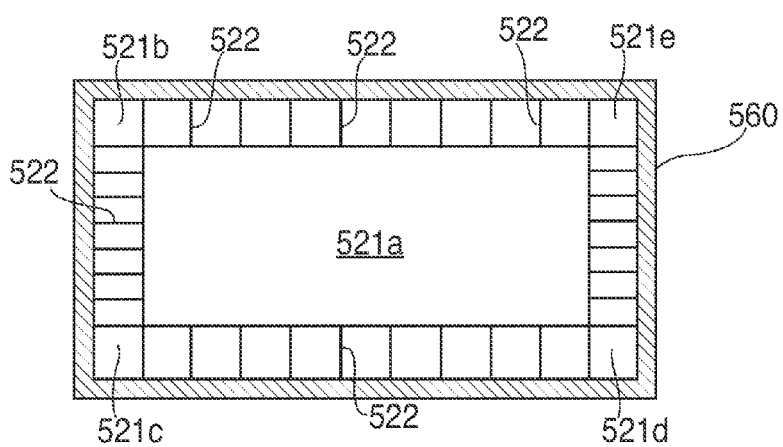
FIG. 5 shows another alternative illustrative cross-sectional view of a grounding layer.

FIG. 5 shows another alternative illustrative cross-sectional view of a grounding layer 520, ground traces 522, and shielding layer 560. As shown in this embodiment, grounding layer can include planer regions 521a-e. A portion of these planer regions (i.e., regions 521b-e) may directly interface with shielding layer 560. Planer region 521a may interface with shielding layer 560 via one or more ground traces 522.

Figure 6:
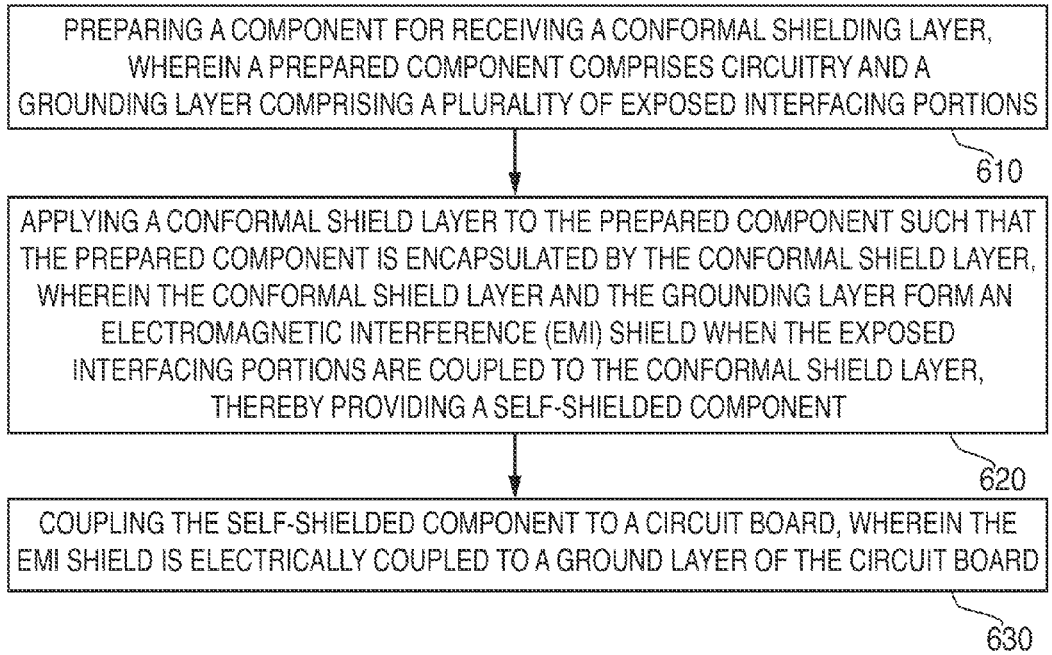
FIG. 6 shows an illustrative flowchart of steps that may be taken to make a self-shielded component according to an embodiment.

FIG. 6 shows an illustrative flowchart of steps that may be taken to make a self-shielded component according to an embodiment. Starting with step 610, a component for receiving a conformal shielding layer is prepared, wherein the prepared component includes circuitry and a grounding layer. The grounding layer can include several exposed interfacing portions. For example, the component can be an integrated circuit package such as a memory package (e.g., a volatile memory package or non-volatile memory package) or a processor package. The package may be constructed to include a grounding layer that abuts or is integrated with a substrate of the package. In some embodiments, a portion of the component may be removed to expose the interfacing portions.

At step 620, a conformal shield layer is applied to the prepared component such that the prepared component is encapsulated by the conformal shield layer. The conformal shield layer and the grounding layer can form an electromagnetic interference (EMI) shield when the exposed interfacing portions are coupled to the conformal shield layer, resulting in a self-shielded component. For example, the conformal shield layer may be applied using an electroplating process, sputtering process, or any other process suitable for laying down conductive material.

At step 630, the self-shielded component can be coupled to a circuit board. For example, the self-shielded component can be soldered to the circuit board to connect power, ground, and signal contacts.

Figure 7:
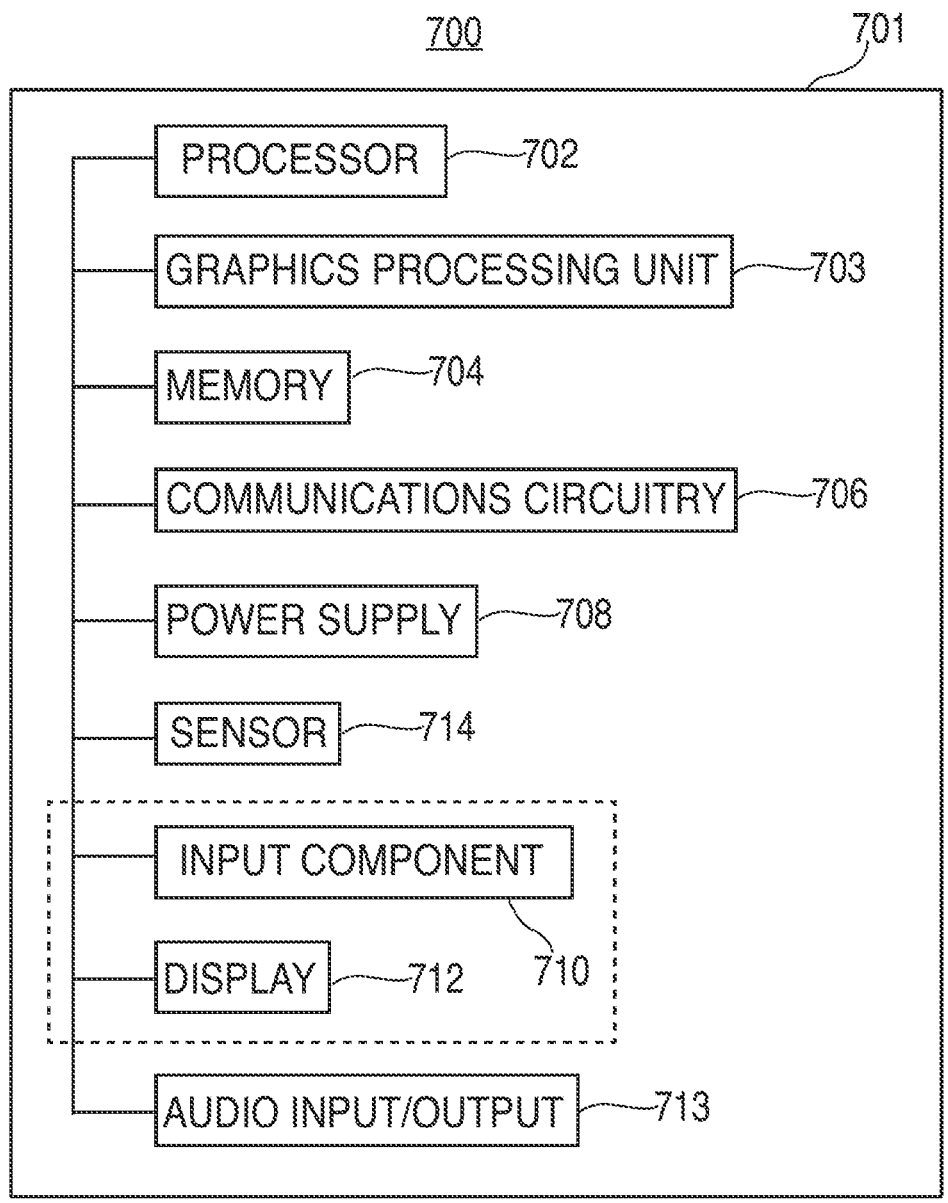
FIG. 7 is a schematic view of an electronic device in accordance with one embodiment.

FIG. 7 is a schematic view of an illustrative electronic device 700. Electronic device 700 may be any portable, mobile, or hand-held electronic device that can operate wherever the user travels. Alternatively, electronic device 700 may not be portable at all, but may instead be generally stationary. Electronic device 700 can include, but is not limited to, a music player, video player, still image player, game player, other media player, music recorder, movie or video camera or recorder, still camera, other media recorder, radio, medical equipment, domestic appliance, transportation vehicle instrument, musical instrument, calculator, cellular telephone, smart phone, other wireless communication device, personal digital assistant, remote control, pager, computer (e.g., a desktop, laptop, tablet, server, etc.), monitor, television, stereo equipment, set up box, set-top box, boom box, modem, router, printer, and combinations thereof. In some embodiments, electronic device 700 may perform a single function (e.g., a device dedicated to presented asset content rendered at the datacenter and for processing inputs to control aspects of the asset content presented on the device) and, in other embodiments, electronic device 700 may perform multiple functions (e.g., a device that locally renders asset content for presentation, plays music, and receives and transmits telephone calls).

First electronic device 700 may include a processor or control circuitry 702, graphics processing unit 703, memory 704, communications circuitry 706, power supply 708, input component 710, display 712, audio input/output 713, and sensor 714. Electronic device 700 may also include a bus 716 that may provide one or more wired or wireless communications links or paths for transferring data and/or power to, from, or between various other components of electronic device 700. In some embodiments, one or more components of electronic device 700 may be combined or omitted. Moreover, first electronic device 700 may include other components not combined or included in FIG. 7 and/or several instances of the components shown in FIG. 7. For the sake of simplicity, only one of each of the components of electronic device 700 is shown in FIG. 7.

Memory 704 of electronic device 700 may include one or more storage mediums, including for example, a hard-drive, flash memory, permanent memory such as read-only memory ("ROM"), semi-permanent memory such as random access memory ("RAM"), any other suitable type of storage component, or any combination thereof. Memory 704 may include cache memory, which may be one or more different types of memory used for temporarily storing data for electronic device applications. In some embodiments, memory 704 may be a self-shielded component according to various embodiments. Memory 704 may store media data (e.g., music and image files), software (e.g., for implementing functions on electronic device 700), firmware, preference information (e.g., media playback preferences), transaction information (e.g., information such as credit card information), wireless connection information (e.g., information that may first electronic device 700 to establish a wireless connection), subscription information (e.g., information that keeps track of gaming services or other media a user subscribes to), contact information (e.g., telephone numbers and e-mail addresses), calendar information, any other suitable data, or any combination thereof.

Communications circuitry 706 of electronic device 700 may be provided to allow electronic device 700 to communicate with one or more other electronic devices, datacenters, or servers using any suitable communications protocol. For example, communications circuitry 706 may support Wi-Fi (e.g., an 802.11 protocol), Ethernet, Bluetooth™, Bluetooth™ Low Energy ("BLE"), high frequency systems (e.g., 900 MHz, 2.4 GHz, and 5.6 GHz communication systems), infrared, transmission control protocol/internet protocol ("TCP/IP") (e.g., any of the protocols used in each of the TCP/IP layers), hypertext transfer protocol ("HTTP"), BitTorrent™, file transfer protocol ("FTP"), real-time transport protocol ("RTP"), real-time streaming protocol ("RTSP"), secure shell protocol ("SSH"), any communications protocol that may be used by wireless and cellular telephones and personal e-mail devices (e.g., Global System for Mobile Communications ("GSM"), GSM plus Enhanced Data rates for GSM Evolution ("EDGE"), Code Division Multiple Access ("CDMA"), Orthogonal Frequency-Division Multiple Access ("OFDMA"), high speed packet access ("HSPA"), multi-band, etc.), any other communications protocol, or any combination thereof. Communications circuitry 106 may also include circuitry that can enable electronic device 700 to be electrically coupled to another device (e.g., a game controller or an accessory device) and communicate with that other device, either wirelessly or via a wired connection.

Power supply 708 of electronic device 700 may provide power to one or more of the components of electronic device 700. In some embodiments, power supply 708 can be coupled to a power grid (e.g., when device 700 is not a portable device, such as a desktop computer). In some embodiments, power supply 708 can include one or more batteries for providing power (e.g., when device 700 is a portable device, such as a smartphone). As another example, power supply 708 can be configured to generate power from a natural source (e.g., solar power using solar cells).

One or more input components 710 of electronic device 700 may be provided to permit a user to interact or interface with first electronic device 700. For example, input component 710 can take a variety of forms, including, but not limited to, a touch pad, dial, control pad, touch screen, one or more buttons (e.g., a keyboard), mouse, joy stick, track ball, microphone, camera, proximity sensor, light detector, and combinations thereof. Each input component 710 can be configured to provide one or more dedicated control functions for making selections or issuing commands associated with operating electronic device 700.

Electronic device 700 may also include one or more output components that may present information (e.g., graphical, audible, and/or tactile information) to a user of first electronic device 700. An output component of electronic device 700 may take various forms, including, but not limited to, audio speakers, headphones, audio line-outs, visual displays, antennas, infrared ports, rumblers, vibrators, or combinations thereof.

For example, as shown in FIG. 7, electronic device 700 may include display 712 as an output component. Display 712 may include any suitable type of display or interface for presenting visual data to a user. In some embodiments, display 712 may include a display embedded in electronic device 700 or coupled to electronic device 700 (e.g., a removable display). Display 712 may include, for example, a liquid crystal display ("LCD"), a light emitting diode ("LED") display, an organic light-emitting diode ("OLED") display, a surface-conduction electron-emitter display ("SED"), a carbon nanotube display, a nanocrystal display, any other suitable type of display, or combination thereof. Alternatively, display 712 can include a movable display or a projecting system for providing a display of content on a surface remote from first electronic device 700, such as, for example, a video projector, a head-up display, or a three-dimensional (e.g., holographic) display. As another example, display 712 may include a digital or mechanical viewfinder, such as a viewfinder of the type found in compact digital cameras, reflex cameras, or any other suitable still or video camera.

In some embodiments, display 712 may include display driver circuitry, circuitry for driving display drivers, or both. Display 712 can be operative to display content (e.g., asset content, application screens for applications implemented on first electronic device, information regarding ongoing communications operations, information regarding incoming communications requests, device operation screens, etc.) that may be under the direction of processor 702. Display 712 can be associated with any suitable characteristic dimensions defining the size and shape of the display. For example, the display can be rectangular or have any other polygonal shape, or alternatively can be defined by a curved or other non-polygonal shape (e.g., a circular display). Display 712 can have one or more primary orientations for which an interface can be displayed, or can instead or in addition be operative to display an interface along any orientation selected by a user.

It should be noted that one or more input components and one or more output components may sometimes be referred to collectively herein as an input/output ("I/O") component or I/O interface (e.g., input component 710, display 712 audio input/output 713 as I/O component or I/O interface 711). For example, input component 710 and display 712 may sometimes be a single I/O component 711, such as a touch screen, that may receive input information through a user's touch of a display screen and that may also provide visual information to a user via that same display screen.

Audio input/output 713 of electronic device 700 may include any suitable audio codec to outputting audio signals to a speaker and for receiving audio signals from a microphone. In some embodiments, audio 713 may only output audio signals, and in other embodiments, it may only receive audio signals.

Sensor 714 of electronic device 700 may include any suitable motion sensor operative to detect movements of first electronic device 700. For example, sensor 714 may be a motion-sensing component operative to detect movement of first electronic device 700. In some embodiments, sensor 714 may include one or more three-axis acceleration motion sensors (e.g., an accelerometer) operative to detect linear acceleration in three directions (i.e., the x- or left/right direction, the y- or up/down direction, and the z- or forward/backward direction). As another example, sensor 714 may include one or more single-axis or two-axis acceleration motion sensors which may be operative to detect linear acceleration only along each of the x- or left/right direction and the y- or up/down direction, or along any other pair of directions. In some embodiments, sensor 714 may include an electrostatic capacitance (e.g., capacitance-coupling) accelerometer that is based on silicon micro-machined micro electro-mechanical systems ("MFMS") technology, including a heat-based MEMS type accelerometer, a piezoelectric type accelerometer, a piezo-resistance type accelerometer, or any other suitable accelerometer.

In some embodiments, sensor 714 may be operative to directly or indirectly detect rotation, rotational movement, angular displacement, tilt, position, orientation, motion along a non-linear (e.g., arcuate) path, or any other non-linear motions. In some embodiments, sensor 714 may alternatively or additionally include one or more gyro-motion sensors or gyroscopes for detecting rotational movement. For example, sensor 714 may include a rotating or vibrating element. Using sensor 714, first electronic device 700 can determine an orientation of display 712, for example.

Processor 702 of electronic device 700 may include any processing circuitry operative to control the operations and performance of one or more components of first electronic device 700. For example, processor 702 may receive input signals from input component 710 and/or drive output signals through display 712. In some embodiments, as shown in FIG. 7, processor 702 may be used to run software 717. Software 717 may include, but is not limited to, an operating system, one or more operating system applications, firmware applications, media playback applications, media editing applications, or any other suitable applications. For example, processor 702 may load software 717 as a user interface program to determine how instructions or data received via an input component 710 or other component of device 700 may manipulate the way in which information is stored and/or provided to the user via an output component (e.g., display 712). Software 717 may be accessed by processor 702 from any suitable source, such as from memory 704 (e.g., via bus 716), or from any other suitable source. Electronic device 700 (e.g., processor 702, memory 704, or any other components available to device 700) may be configured to process graphical data at various resolutions, frequencies, intensities, and various other characteristics as may be appropriate for the capabilities and resources of first electronic device 700. In some embodiments, processor 702 may be a self-shielded component according to an embodiment.

Electronic device 700 may also be provided with a housing 701 that may at least partially enclose one or more of the components of first electronic device 700 for protection from debris and other degrading forces external to device 700. In some embodiments, one or more of the components of first electronic device 700 may be provided within its own housing (e.g., input component 710 may be an independent keyboard or mouse within its own housing that may wirelessly or through a wire communicate with processor 702, which may be provided within its own housing).

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope.

What is claimed is:

1. A self-shielded component, comprising:
    an integrated circuit package comprising:
        a substrate;
        a ground layer existing within the substrate and comprising a planar region and a plurality of shield layer interfacing portions that extend away from a periphery of the planar region; and
        a die mounted on the substrate; and
    a conformal shield layer disposed about the integrated circuit package and interfacing with the plurality of shield layer interfacing portions, wherein the conformal shield layer and the ground layer form an electromagnetic interference (EMI) shield, wherein the conformal shield layer interfaces only with the plurality of shield layer interfacing portions and not the planar region.

2. The component of claim 1, further comprising:
    a plurality of conductive members coupled to the substrate and electrically coupled to the around layer, wherein the conductive members are operative to be coupled to a logic board comprising a ground plane such that when the component is mounted to the logic board, the ground plane and the around layer are electrically coupled via the conductive members.

3. The component of claim 1, wherein the EMI shield comprises an interior space in which the die resides.

4. The component of claim 1, wherein the integrated circuit package is selected from the group consisting of a non-volatile memory package and a processor package.

5. The component of claim 1, wherein the EMI shield comprises a top layer, a plurality of side layers, and a bottom layer, wherein the plurality of side layers exist between the top and bottom layers, and wherein the bottom layer is defined by the ground layer and the top layer and the plurality of side layers are defined by the conformal shield layer.

6. The component of claim 5, wherein the top, side, and bottom layers define a shielded space, and wherein the die exists within the shielded space.

7. The component of claim 5, wherein the bottom layer interfaces with the plurality of the side layers via the at least one shield layer interfacing region.

8. The component of claim 1, wherein the ground layer comprises a planer region, and wherein the at least one shield layer interfacing region extends from a periphery of the planer region.

9. The component of claim 8, wherein the at least one shield layer interfacing region comprises a plurality of shield layer interfacing regions, wherein the plurality of shield layer interfacing regions are dimensioned and arranged such that a gap existing between any two adjacent shield layer interfacing region is sized to prevent transmission of wireless signals through the gap.

10. The component of claim 1, wherein the substrate and the around layer are integrally formed.

11. A system comprising:
    a circuit board;
    a self-shielded component mounted to the circuit board, the self-shielded component comprising an electromagnetic interference (EMI) shield that encompasses circuitry contained within a shielded interior space of the EMI shield, wherein the EMI shield comprises:
        a conformal coating layer that drapes over the circuitry; and
        a bottom layer comprising a planar region and a plurality of conductive traces that extend away from a periphery of the planar region and interface with the conformal coating layer, wherein the bottom layer is disposed below the circuitry, and wherein the conformal coating layer and the bottom layer define the shielded interior space, wherein the conformal coating layer interfaces only with the plurality of conductive traces and not the planar region; and
    at least one EMI generating component mounted to the circuit board capable of generating EMI signals that can potentially interfere with the circuitry contained with the shielded interior space of the EMI shield, wherein the EMI shield effectively shields the circuitry from any EMI signals generated by the at least one EMI generating component.

12. The system of claim 11, wherein the circuit board comprises a around plane, wherein the EMI shield is electrically coupled to the around plane.

13. The system of claim 11, wherein the bottom layer is integrated with a substrate of the self-shielded component.

14. The system of claim 11, wherein the bottom layer comprises a plurality of conformal coating interfacing portions that interface with the conformal coating layer, wherein a gap size formed between adjacent interfacing portions are dimensioned to block passage of the EMI signals.

* * * * *